United States Patent
Tanimoto et al.

(10) Patent No.: US 8,975,182 B2
(45) Date of Patent: Mar. 10, 2015

(54) METHOD FOR MANUFACTURING SEMICONDUCTOR DEVICE, AND SEMICONDUCTOR DEVICE

(75) Inventors: Satoshi Tanimoto, Yokohama (JP); Yusuke Zushi, Nottingham (GB); Yoshinori Murakami, Yokohama (JP); Takashi Iseki, Oume (JP); Masato Takamori, Oume (JP); Shinji Sato, Niiza (JP); Kohei Matsui, Tsukuba (JP)

(73) Assignees: Nissan Motor Co., Ltd., Yokohama (JP); Sumitomo Metal Mining Co., Ltd., Tokyo (JP); Sanken Electric Co., Ltd., Niiza (JP); Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 14/234,476

(22) PCT Filed: Jul. 27, 2012

(86) PCT No.: PCT/JP2012/069096
§ 371 (c)(1),
(2), (4) Date: Jan. 23, 2014

(87) PCT Pub. No.: WO2013/015402
PCT Pub. Date: Jan. 31, 2013

(65) Prior Publication Data
US 2014/0191250 A1    Jul. 10, 2014

(30) Foreign Application Priority Data

Jul. 28, 2011    (JP) ................. 2011-165508

(51) Int. Cl.
*H01L 21/44*    (2006.01)
*H01L 23/48*    (2006.01)
(Continued)

(52) U.S. Cl.
CPC .............. *H01L 24/80* (2013.01); *B23K 35/282* (2013.01); *B23K 35/286* (2013.01); *B23K 35/007* (2013.01); *B23K 35/025* (2013.01);
(Continued)

(58) Field of Classification Search
USPC ........................... 257/734–786; 438/597–688
See application file for complete search history.

(56) References Cited

U.S. PATENT DOCUMENTS

2003/0019915 A1*    1/2003    Korischem et al. ........... 228/223
2008/0136019 A1*    6/2008    Johnson et al. ................ 257/737
2008/0206590 A1*    8/2008    Ikeda et al. .................... 428/650

FOREIGN PATENT DOCUMENTS

| JP | 63-16628 A | 1/1988 |
| JP | 2001-93916 A | 4/2001 |
| JP | 2009-125753 A | 6/2009 |

*Primary Examiner* — Karen Kusumakar
(74) *Attorney, Agent, or Firm* — Global IP Counselors, LLP

(57) ABSTRACT

A method for manufacturing a semiconductor device is carried out by readying each of a semiconductor element, a substrate having Cu as a principal element at least on a surface, and a ZnAl solder chip having a smaller shape than that of the semiconductor element; disposing the semiconductor element and the substrate so that respective bonding surfaces face each other, and sandwiching the ZnAl eutectic solder chip between the substrate and the semiconductor element; increasing the temperature of the ZnAl solder chip sandwiched between the substrate and the semiconductor element while applying a load to the ZnAl solder chip such that the ZnAl solder chip melts to form a ZnAl solder layer; and reducing the temperature of the ZnAl solder layer while applying a load to the ZnAl solder layer.

14 Claims, 5 Drawing Sheets

(51) Int. Cl.
      H01L 23/52    (2006.01)
      H01L 29/40    (2006.01)
      H01L 23/00    (2006.01)
      B23K 35/28    (2006.01)
      B23K 35/00    (2006.01)
      B23K 35/02    (2006.01)
      C22C 18/04    (2006.01)
      B23K 1/00     (2006.01)
      B23K 1/008    (2006.01)
      B23K 1/19     (2006.01)
      H01L 29/16    (2006.01)
      H01L 29/20    (2006.01)

(52) U.S. Cl.
      CPC ............... *C22C 18/04* (2013.01); *B23K 1/0016* (2013.01); *B23K 1/008* (2013.01); *B23K 1/19* (2013.01); *H01L 24/32* (2013.01); *H01L 24/83* (2013.01); *H01L 24/29* (2013.01); *H01L 29/1602* (2013.01); *H01L 29/1608* (2013.01); *H01L 29/2003* (2013.01); *B23K 2201/40* (2013.01); *B23K 2201/34* (2013.01); *B23K 2201/42* (2013.01); *H01L 2224/32225* (2013.01); *H01L 2924/01322* (2013.01); *H01L 2224/83001* (2013.01); *H01L 2224/83447* (2013.01); *H01L 2924/10254* (2013.01); *H01L 2924/10272* (2013.01); *H01L 2924/1033* (2013.01); *H01L 2924/15787* (2013.01)
      USPC ........... 438/658; 438/666; 438/660; 438/688; 257/773; 257/778; 257/780

METHOD FOR MANUFACTURING SEMICONDUCTOR DEVICE, AND SEMICONDUCTOR DEVICE

CROSS-REFERENCE TO RELATED APPLICATIONS

This application is a U.S. National stage application of International Application No. PCT/JP2012/069096, filed Jul. 27, 2012, which claims priority under to Japanese Patent Application No. 2011-165508 filed in Japan on Jul. 28, 2011.

BACKGROUND

1. Field of the Invention

The present invention relates to a method for manufacturing a semiconductor device in which a semiconductor element and a substrate are bonded using a zinc-aluminum based bonding material, and to a semiconductor device thereby obtained.

2. Background Information

Wide bandgap semiconductors such as silicon carbide (SiC) and gallium nitride (GaN) are capable of handling large currents at a high actuation voltage, and a high heat resistance is therefore required from portions that are bonded by soldering. Therefore, there has been proposed a zinc-aluminum-based ZnAl eutectic solder as a material for bonding high-temperature actuation devices such as power semiconductor devices (Japanese Laid-Open Patent Publication No. 2009-125753).

SUMMARY

However, when the inventors in the present application attempted to bond a power semiconductor element and a substrate using the bonding method disclosed in the Japanese Laid-Open Patent Publication No. 2009-125753, it was found that the bonding strength varied significantly.

An object of the present invention is to minimize variation in the strength of bonding between a semiconductor element and a substrate, and to improve the yield of the obtained product.

In the present invention, ZnAl eutectic solder sandwiched between a semiconductor element and a substrate having Cu as a principal element on the surface is increased in temperature while being subjected to a load, caused to melt, and subsequently reduced in temperature while being subjected to a load, whereby the above object is achieved.

According to the present invention, ZnAl eutectic phase structures change to ZnAl eutectoid phase structures, and the ZnAl solder layer becomes a structure having a small number of ZnAl eutectic phases and a large number of Zn phases and ZnAl eutectoid phases. The stress difference at the phase interfaces is thereby minimized; as a result, the variation in bonding strength is minimised and the yield of the obtained product is improved.

BRIEF DESCRIPTION OF THE DRAWINGS

Referring now to the attached drawings which form a part of this original disclosure.

DETAILED DESCRIPTION OF THE EMBODIMENTS

Figure 1:
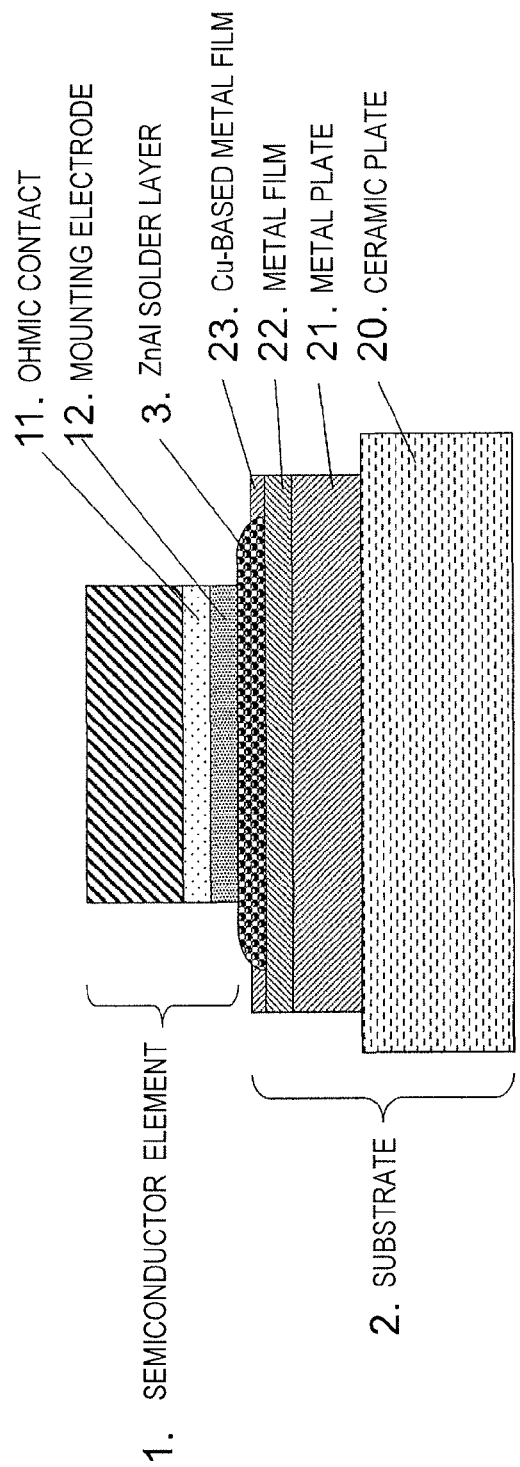
FIG. 1 is a cross-section view showing a semiconductor device according to an embodiment of the present invention.
Figure 2:
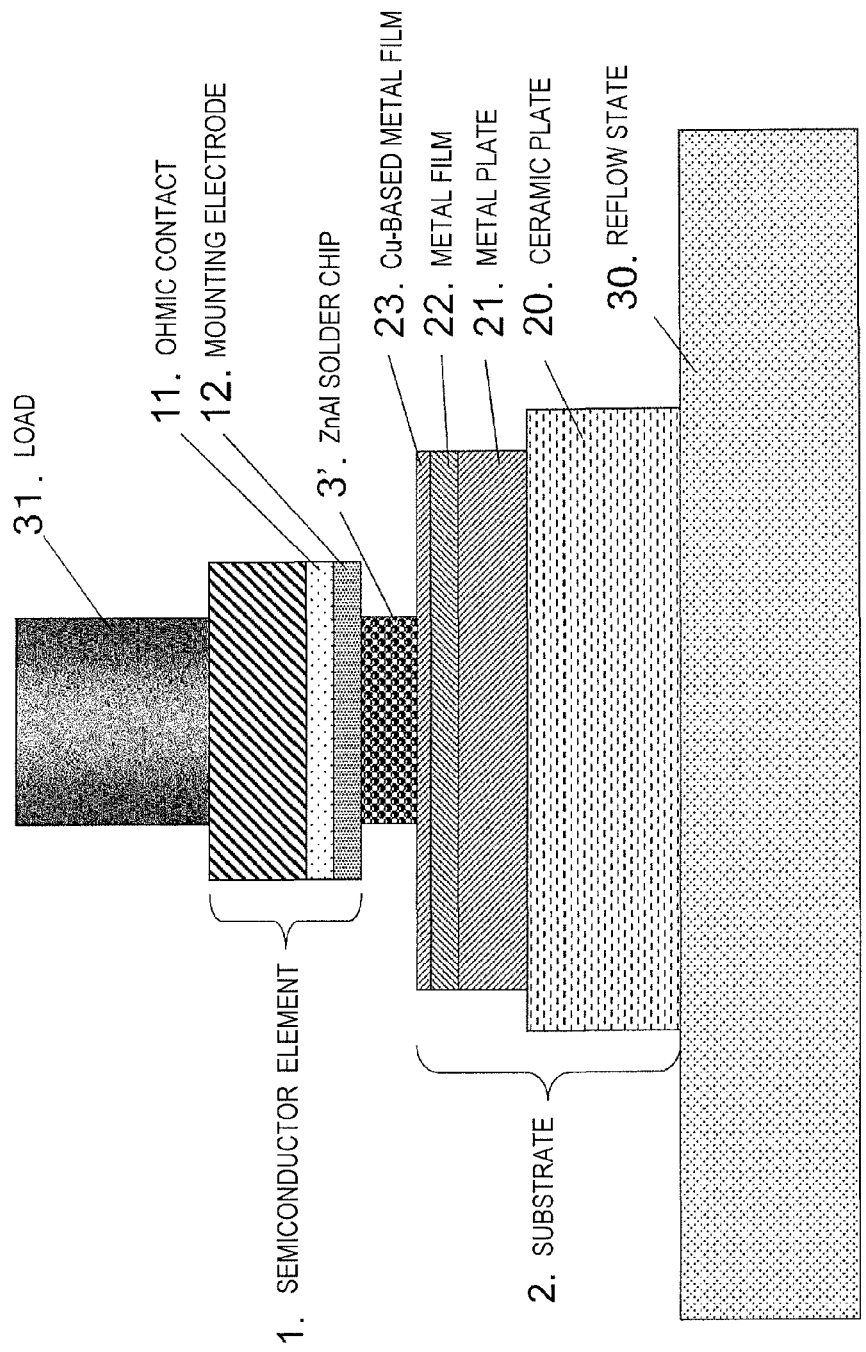
FIG. 2 is a cross-section view for illustrating a method for manufacturing the semiconductor device in FIG. 1.

The structure of a semiconductor device according to an embodiment of the present invention will now be described with reference to the cross-section view in FIG. 1. The semiconductor element 1/ZnAl solder layer 3/substrate 2 structure shown in FIG. 1 will be referred to as a semiconductor device according to the present example. FIGS. 1 and 2 are shown schematically in order to facilitate understanding of the present invention, and the relationship between the thickness and the planar dimensions, the proportion of thicknesses of the layers, and the like may be exaggerated.

In the following description, the present invention will be described in detail using an example in which a SiC power element is used as the semiconductor element, and a substrate in which a Cu plate is affixed to both surfaces of a SiN ceramic plate is used as the substrate. However, this is merely an example; a GaN element, a diamond element, a ZnO element, or another wide bandgap semiconductor element, or a Si semiconductor element intended for high-temperature usage (SOI element or sensor element), can be equally employed. The substrate is not limited to Cu affixed to an SiN ceramic plate, and may be: a Cu substrate affixed to another type of ceramic substrate; a metal substrate other than Cu (e.g., Al or CuMo) affixed to another type of ceramic substrate ($Al_2O_3$ or AlN) or an insulating body; or a simple metal plate made from Cu or a standalone metal other than Cu (without a ceramic or an insulating plate).

Numeral 1 represents a silicon carbide (SiC) power semiconductor element. An ohmic contact 11 is formed on the reverse surface. A mounting electrode 12 covers the surface of the ohmic contact 11 in order, e.g., to improve the solder wettability, prevent ingress of the solder, and improve adhesion. An example of the mounting electrode 12 is an evaporated Ti/Ni/Ag multilayer film (a layered structure in which the Ti is in contact with the Ohmic contact 11 and Ag represents the outermost surface).

Numeral 2 represents the substrate. The substrate 2 according to the present example has a structure in which a metal plate 21 made from Cu, Al, or another metal is brazed or otherwise affixed on at least one surface of a SiN ceramic plate 20. The surface of the metal plate 21 is covered by a metal film 22 comprising N, Pt, Pd, or another metal exhibiting wettability, adhesive properties, and barrier properties with respect to solder. In addition, a Cu-based metal film 23 having Cu as a principal element and a thickness of 20 nm to 200 nm is formed so as to coat the surface of the metal film 22.

A ZnAl solder layer 3 is sandwiched between the semiconductor element 1 and the substrate 2. The composition of Zn and Al in the ZnAl solder layer 3 in the present example is preferably eutectic (Al concentration=5 mass %) or substantially eutectic (Al concentration within 5±2 mass %). In addition, the ZnAl solder layer 3 may contain a trace amount (no greater than 1 mass %) of Ge, P, or another element in order to improve the hardness of the solder material, wettability during bonding, and viscosity of the molten liquid. In the semiconductor device of the present invention, no particular limitation exists with regards to the thickness of the ZnAl solder layer 3. However, in practical use, the thickness of the ZnAl solder layer 3 is preferably no greater than about 100 µm, further preferably no greater than 50 µm, and even further preferably no greater than 30 µm.

The structural characteristic of the ZnAl solder layer 3 according to the present example is that although the composition of the ZnAl solder layer 3 according to the present example is eutectic or substantially eutectic, the structure thereof either does not contain a eutectic structure at all or contains an eutectic structure to an extent that does not exceed 20%. This matter will be described further below.

Next, a description will be given for a method for manufacturing a semiconductor device having the above structure. First, precursor materials A to C having the following specifications are readied.

Precursor material A is a power semiconductor element 1 made from silicon carbide (SiC) shown in FIG. 1 mentioned further above. Silicon carbide (SiC) semiconductor elements 1 that are commercially available substantially have, in reality, the structure shown in FIG. 1. Therefore, as long as a semiconductor element of such description is used, there is no need for a particular modification in order to carry out the present invention.

Precursor material B is the substrate 2 shown in FIG. 1 mentioned further above. The Cu installed on the surface of the substrate 2 has a property of readily forming an alloy with a Zn component in molten ZnAl solder. Therefore, the Cu has an effect of promoting the spread of the molten ZnAl eutectic solder and contributing to the reduction in reflow time, as well as reducing the thickness of the ZnAl solder layer 3 formed. The substrate 2 is widely commercially available, and is therefore extremely easy to obtain.

Precursor material C is a chip-shaped ZnAl solder chip 3' prepared so as to have an eutectic composition (Al concentration=5 mass %) or a substantially eutectic composition (Al concentration within 5±2 mass %). The dimensions of the ZnAl solder chip 3' are set to be smaller than the dimensions of a die for the semiconductor element 1. In the present example, the thickness of the ZnAl solder chip 3' is preferably no greater than 50 µm and is further preferably 30 µm. The ZnAl solder chip 3' is exposed to the atmosphere before bonding; therefore, it shall be apparent that a natural oxide film is formed on the surface. However, in the present example, a semiconductor device can be produced without any problems, even when a ZnAl solder chip 3' of such description is used.

When the precursor materials A to C are ready, organic cleaning is performed using a solvent such as acetone or isopropyl alcohol, and contaminants adhering to the surface of the precursor materials are removed.

Next, the precursor materials A to C are installed in a decompression reflow device. The decompression reflow device has an exhaust capacity enabling decompression down to about 5 millibars, and is configured so as to be able to introduce an inert gas (nitrogen or argon gas) having a purity of no less than 99.99%.

FIG. 2 is a cross-section view showing the precursor materials A to C placed in a sample compartment (chamber in which a reflow stage 30 is placed) of a decompression reflow device. As shown in the drawing, the substrate 2 is placed on the reflow stage 30, the ZnAl solder chip 3' and the semiconductor element 1 with the bonding surface facing downwards are overlapped so as to be aligned with the portion on the substrate 2 to be bonded, and a load member 31 is placed on top thereof.

There are important points with regards to the above in relation to the manufacture of a semiconductor device according to the present example. The first point is the manner in which the ZnAl solder chip 3' is placed. It is important to place the ZnAl solder chip 3' so that when the ZnAl solder chip 3' and the semiconductor element 1 are overlapped, the ZnAl solder chip 3' does not protrude beyond the outer periphery of the semiconductor element 1. Having the dimensions of the ZnAl solder chip 3' so as to be smaller than those of the semiconductor element 1, placing the ZnAl solder chip 3' so as to not protrude beyond the outer periphery of the semiconductor element 1, and causing the ZnAl solder chip 3' to melt while applying a load, cause the Zn or Al natural oxide film coating covering the molten ZnAl solder liquid to pulverize instantaneously, and make it possible to cause a bonding reaction between the molten liquid and the substrate 2 and between the molten liquid and the semiconductor element 1 in a swift and reproducible manner. In addition, the thickness of the resulting ZnAl solder layer 3 can be controlled so as to be small and uniform.

The second point is to use a static load member 31. In the present example, a gentle pressure is applied to the semiconductor element 1 during solder melting in order to form a satisfactory bond. The necessary load is preferably no less than 0.1 g/cm$^2$ and further preferably no less than 0.3 g/cm$^2$. For example, for a semiconductor element 1 measuring 4 mm$^2$, the load to be used is preferably no less than 0.4 g and further preferably no less than 1.2 g. In particular, if a load of no less than 0.3 g/cm$^2$ is employed, the thickness of the ZnAl solder layer 3 is further reduced, making it possible to reduce the thickness to 50 µm or less, such a thickness having a property in which eutectic phase structures do not readily form.

When the above preparations are done, a reflow step is performed. First, air in the sample compartment of the decompression reflow device is discharged. When the pressure in the sample compartment has fallen to 5 millibar or less, the inert gas is introduced. This operation is performed several times, and the air in the sample compartment is replaced with the inert gas. The sample compartment is thereby filled with the inert gas.

Then, the reflow stage 30 or the entire sample compartment is heated, the temperature of the precursor materials A to C is increased to about 200° C. and maintained for approximately 2 minutes. At this time, an inert gas containing formic acid vapor may be introduced and removal of contaminant organic matter promoted.

Next, the introduction of the inert gas is discontinued, gas discharging is restarted, and the pressure in the sample compartment is reduced to 5 millibar or less; at the same time, the reflow stage 30 or the entire sample compartment is further heated, and the temperature of the precursor materials A to C is increased to and maintained at a predetermined temperature defined within a temperature range ranging from the liquidus temperature of the ZnAl solder chip 3' to 420° C. A holding time of as much as 5 minutes will be adequate. A typical holding time when the predetermined temperature is 415° C. is 1 minute. When the melting point (382° C.) is exceeded, the ZnAl solder chip 3' is turned into a molten liquid, flattened by the load from the load member 31, and caused to radially spread on the substrate 2 surrounding the semiconductor element 1.

Next, the inert gas is introduced into the sample compartment. When the pressure has increased to a predetermined pressure, a reduction in the temperature of the reflow stage 30 or the entire sample compartment is immediately commenced. In this instance, it is preferable that when the temperature has fallen below 275° C., which is the eutectoid temperature of the ZnAl alloy, annealing is performed for several minutes to several tens of minutes while the temperature is temporarily maintained or reduced at a gradual pace. This annealing step acts effectively to convert ZnAl eutectic phase structures, which are harmful and thermally unstable, contained in the ZnAl solder layer 3 into ZnAl eutectoid phase structures and Zn phase structures. In other words, the annealing step has an effect of eliminating eutectic phase structures which are generated when the molten ZnAl eutectic solder liquid is caused to rapidly solidify. However, if a load member 31 of less than 0.3 g/cm$^2$ is used during the reflow, this conversion occurs over an extremely short period of time, and the annealing step can therefore be omitted.

Then, the reflow stage 30 or the entire sample compartment is cooled to room temperature, completing the semiconductor device of the present example.

In a semiconductor device in which a ZnAl eutectic solder disclosed in Patent Citation 1 is used, there is significant variation in bonding strength, and it is difficult to manufacture a product that is suitable for practical use. As a result of examining in detail a large number of defective samples of such description, the inventors in the present application arrived at the following explanation for the abovementioned problems.

Figure 3:
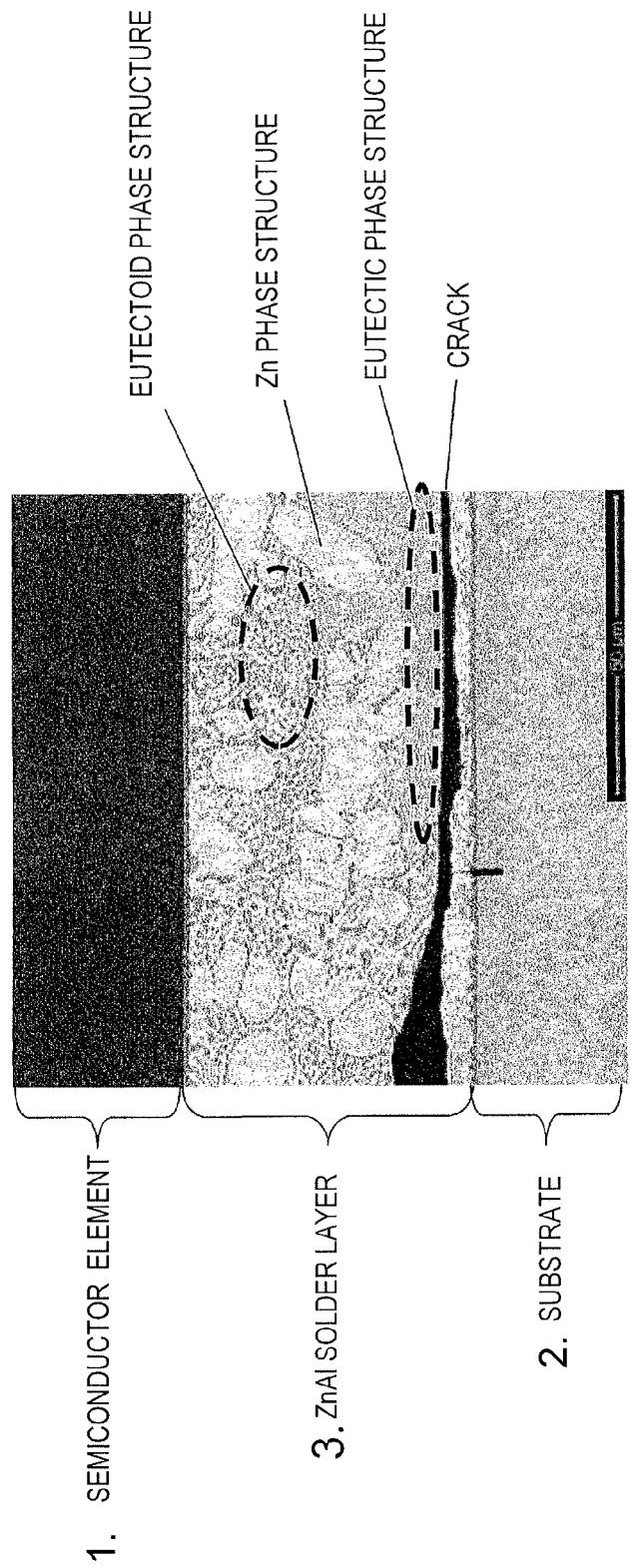
FIG. 3 is a scanning electron micrograph of a cross-section of the semiconductor device produced according to the method disclosed in Japanese Laid-Open Patent Publication No. 2009-125753.

Specifically, in a ZnAl solder layer 3 of a semiconductor element 1/ZnAl solder layer 3/substrate 2 structure in which a ZnAl solder chip 3' is used, a high concentration of ZnAl eutectic phase structures are normally formed. As shown in the cross-section scanning electron micrograph (SEM) in FIG. 3, countless microcracks are formed at the interfaces between the eutectic phase structures (regions resembling stripes on pearl oyster shells) and other structures, i.e., between Zn phase structures (regions having a white uniform contrast) and ZnAl eutectoid phase structures (regions containing scattered small black-contrast dots).

When the proportion of eutectic phase structures contained exceeds 20%, the microcracks rapidly join, readily forming large cracks at the interface of the eutectic phase structures, resulting in a significant decrease in bonding strength. It is presumed that the variation in the manner in which such cracks occur result in the variation in bonding strength. It is thought that normally the presence of a plurality of structures causes stress differences to occur at the interfaces of the structures, generating microcracks as a result.

Figure 4:
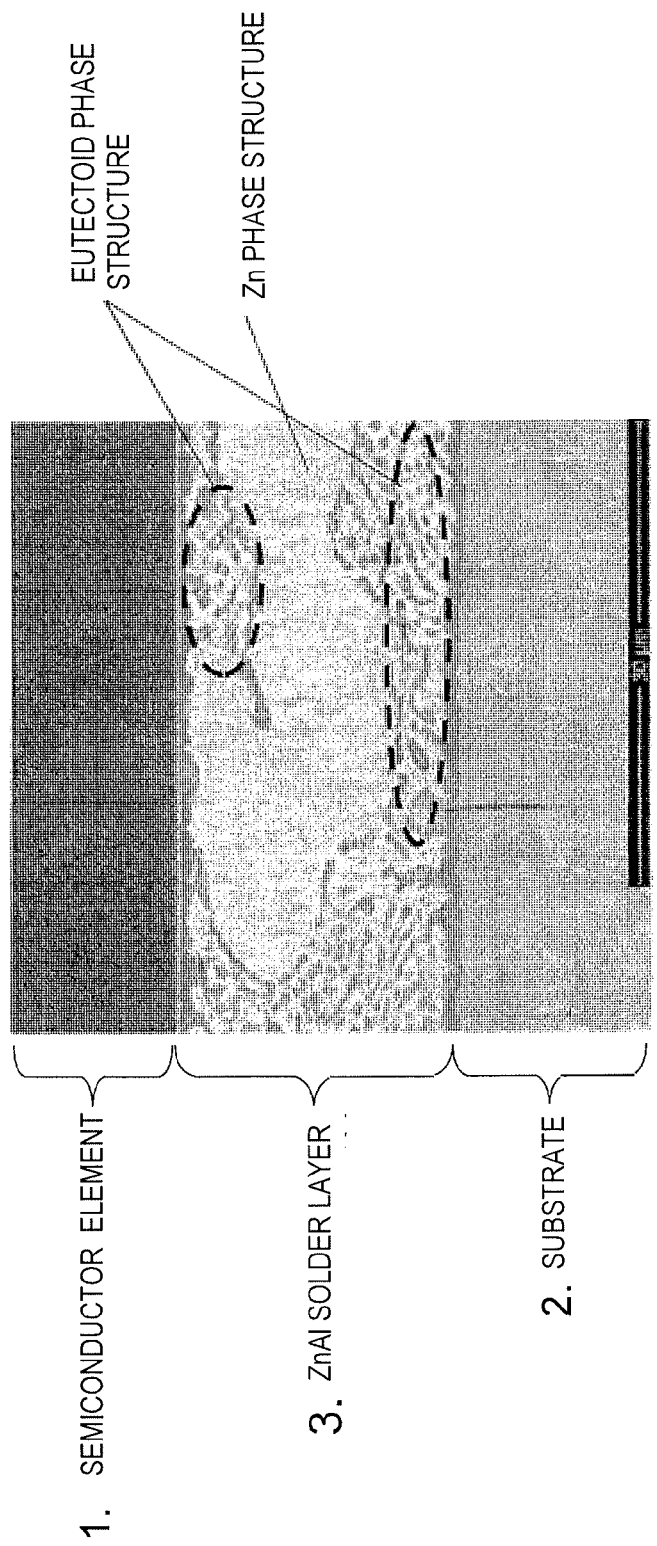
FIG. 4 is a scanning electron micrograph of a cross-section of a semiconductor device produced according to the method for manufacturing a semiconductor device in FIG. 2.

In response, the inventors, with an idea to reduce the formation of ZnAl eutectic phase structures to 20% or less, searched for a manufacturing method that can be implemented, and succeeded in actually forming a structure of such description using the abovementioned manufacturing method and established that a semiconductor device having sufficient bonding strength can be manufactured by adopting the abovementioned structure. FIG. 4 is a cross-sectional scanning electron micrograph of the ZnAl solder layer 3 in a silicon carbide semiconductor element 1/ZnAl solder layer 3/substrate 2 structure produced according to the abovementioned manufacturing method according to the present example.

It can be seen that the ZnAl solder layer 3 in the sample shown comprises only Zn phase structures and ZnAl eutectoid phase structures, and that eutectic phase structures are not contained at all. This micrograph is a typical cross-sectional scanning electron micrograph of a sample in which the thickness of the ZnAl solder layer 3 is no greater than 50 μm. However, it was established that a sample in which the thickness of the ZnAl solder layer 3 is greater than 50 μm has basically the same cross-sectional structure as that in this micrograph (other than the thickness of the ZnAl solder layer 3 being greater).

Figure 5:
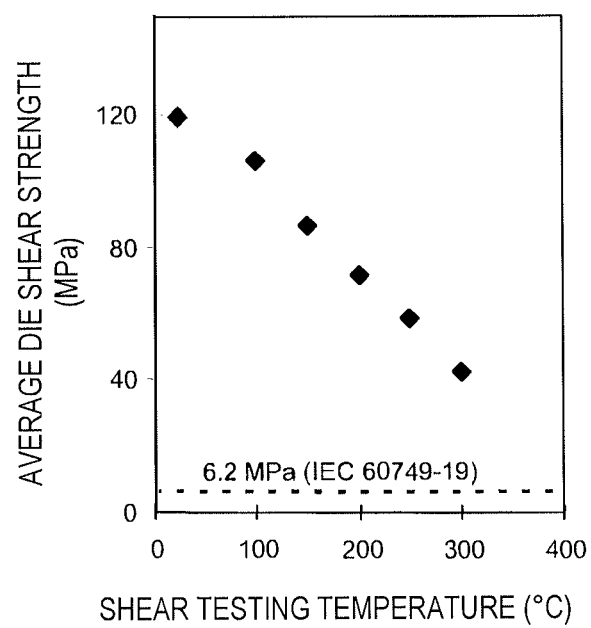
FIG. 5 is a graph showing temperature characteristics of the shear strength of the semiconductor device produced according to the method for manufacturing a semiconductor device in FIG. 2.

In addition, the bonding strength of a semiconductor device having a silicon carbide semiconductor element 1/ZnAl solder layer 3/substrate 2 structure of the present example was evaluated by die shear testing. The size of the silicon carbide semiconductor element 1 in this instance was 2×2 mm$^2$. FIG. 5 is a graph obtained by measuring the bonding strength at different test temperatures along the horizontal axis from room temperature to 300° C. and plotting the average values of the obtained bonding strengths against the test temperature.

As can be seen from FIG. 5, the bonding strength (average value) at room temperature is approximately 120 MPa. This is an extremely satisfactory value equivalent to approximately 20 times that according to the international standard (IEC60749-19) defined in relation to the bonding strength of semiconductor devices. In addition, as can be seen from FIG. 5, although the bonding strength gradually falls with increasing test temperature, it was established that even at 300° C., the bonding strength is still approximately 7 times that according to the standard.

As described above, the solder layer 3 of the semiconductor device according to the present example comprises ZnAl eutectic solder; therefore, the melting point thereof (=liquidus temperature=solidus temperature=eutectic temp) is low, in the vicinity of 382° C., and as a result, the semiconductor device can be manufactured through a soldering treatment lasting 5 minutes or less at a temperature no greater than 420° C. The extent by which the semiconductor device degrades during a soldering treatment lasting a short period of time as described above is negligible. Specifically, according to the present example, it is possible to minimize problems of the semiconductor device failing to withstand the heat during soldering and becoming defective.

In addition, since the solder layer 3 comprises a well-known, simple ZnAl eutectic solder, there is no need to perform a process of adding a special film, and the cost of manufacturing the solder material is prevented from increasing. Specifically, according to the present example, there is no need to produce a special ZnAl solder material coated with an easily reducible metal (Cu, Ag, Au), and the manufacturing cost of the ZnAl solder is kept low.

In addition, according to the present example, as shown in FIG. 5, it is possible to manufacture a semiconductor device having a sufficient bonding strength. In particular, the bonding step according to the present example is not sensitive to the oxygen concentration in the atmosphere, and can be readily achieved using a gas and a generic decompression reflow device commonly used in PbSn soldering. As a result, there is no need for a dedicated reflow device such as a sophisticated reflow device equipped with a substrate heating means provided with an explosion-proof function and the like.

According to the present example, the thickness of the ZnAl solder layer 3 is set to preferably no greater than 50 μm and further preferably no greater than 30 μm, whereby the ZnAl solder layer 3 is formed so as to be extremely thin, resulting in the effect of it being possible to reduce the thermal resistance, against thermal conduction, of the ZnAl solder layer 3.

In the present example, employing a substrate 2 in which the principal element, at least at the surface, is Cu has an effect of promoting the spread of the molten ZnAl eutectic solder and contributing to reducing the reflow time, as well as reducing the thickness of the ZnAl solder layer 3 formed.

In the present example, a ZnAl solder chip 3' having a smaller shape than that of the semiconductor element 1 is used, and caused to melt while being subjected to a static load; therefore, the Zn or Al natural oxide film coating covering the molten ZnAl solder liquid pulverizes instantaneously, making it possible to cause a bonding reaction between the molten liquid and the substrate 2 and between the molten liquid and the semiconductor element 1 in a swift and reproducible manner. In addition, the thickness of the resulting ZnAl solder layer 3 can be controlled so as to be small and uniform. In particular, installing the ZnAl solder chip 3' having a smaller shape than that of the semiconductor element 1 so as to not protrude beyond the outer periphery of the semiconductor element 1 results in the pulverization of the natural oxide film coating being aided in a uniform manner, further enhancing the abovementioned effect.

Also, in the present example, the ZnAl solder chip 3' having a ZnAl eutectic or substantially eutectic composition is increased in temperature while being subjected to a load, caused to melt, and subsequently reduced in temperature, whereby the ZnAl eutectic phase structure changes to a ZnAl eutectoid phase structure, and the ZnAl solder layer becomes a structure having a small number of ZnAl eutectic phases and a large number of Zn phases and ZnAl eutectoid phases. The stress difference at phase interfaces is thereby minimized, and as a result, the variation in bonding strength is minimized and the yield of the obtained product is improved.

According to the present example, the temperature is maintained or reduced at a gradual pace at a temperature immediately below the eutectoid temperature of the ZnAl solder layer during the reduction in temperature, which acts to effectively convert ZnAl eutectic phase structures, which are harmful and thermally unstable, contained in the ZnAl solder layer 3 into ZnAl eutectoid phase structures and Zn phase structures.

In the present example, having the static load be no less than 0.1 g/mm² and preferably no less than 0.3 g/mm² further reduces the thickness of the ZnAl solder layer 3, making it possible to reduce the thickness to 50 µm or less, such a thickness having a property in which eutectic phase structures do not readily form.

KEY

1 Silicon carbide semiconductor device
2 Metal substrate
3 ZnAl solder layer
11 Ohmic contact
12 Mounting electrode
20 Ceramic plate
21 Metal plate
22 Metal film
23 Cu-based metal film
3' ZnAl solder chip
30 Reflow stage
31 Load

The invention claimed is:
1. A method for manufacturing a semiconductor device, comprising:
   readying each of a semiconductor element, a substrate having Cu as a principal element at least on a surface, and a ZnAl eutectic solder chip having a smaller shape than that of the semiconductor element;
   disposing the semiconductor element and the substrate so that respective bonding surfaces face each other, and sandwiching the ZnAl eutectic solder chip between the substrate and the semiconductor element;
   increasing the temperature of the ZnAl eutectic solder chip sandwiched between the substrate and the semiconductor element while applying a load to the ZnAl eutectic solder chip such that the ZnAl eutectic solder chip melts to form a ZnAl solder layer; and
   reducing the temperature of the ZnAl solder layer while applying a load to the ZnAl solder layer such that an eutectic phase structure content of the ZnAl solder layer is entirely decreased in comparison to an eutectic phase structure content of the ZnAl eutectic solder chip.

2. The method for manufacturing a semiconductor device according to claim 1, wherein
   the reducing of the temperature includes maintaining the temperature, or reducing the temperature at a gradual pace, immediately below the eutectoid temperature of the ZnAl solder layer.

3. The method for manufacturing a semiconductor device according to claim 1, wherein
   the load is no less than 0.1 g/mm².

4. The method for manufacturing a semiconductor device according to claim 1, wherein
   a maximum melting temperature of the ZnAl eutectic solder chip is no less than the liquidus temperature of the ZnAl eutectic solder chip and no greater than 420° C.

5. The method for manufacturing a semiconductor device according to claim 4, wherein
   the temperature is held at the maximum melting temperature for 5 minutes or less.

6. The method for manufacturing a semiconductor device according to claim 2, wherein
   the load is no less than 0.1 g/mm².

7. The method for manufacturing a semiconductor device according to claim 6, wherein
   a maximum melting temperature of the ZnAl eutectic solder chip is no less than the liquidus temperature of the ZnAl eutectic solder chip and no greater than 420° C.

8. The method for manufacturing a semiconductor device according to claim 7, wherein
   the temperature is held at the maximum melting temperature for 5 minutes or less.

9. The method for manufacturing a semiconductor device according to claim 2, wherein
   a maximum melting temperature of the ZnAl eutectic solder chip is no less than the liquidus temperature of the ZnAl eutectic solder chip and no greater than 420° C.

10. The method for manufacturing a semiconductor device according to claim 9, wherein
    the temperature is held at the maximum melting temperature for 5 minutes or less.

11. The method for manufacturing a semiconductor device according to claim 3, wherein
    a maximum melting temperature of the ZnAl eutectic solder chip is no less than the liquidus temperature of the ZnAl eutectic solder chip and no greater than 420° C.

12. The method for manufacturing a semiconductor device according to claim 11, wherein
    the temperature is held at the maximum melting temperature for 5 minutes or less.

13. A semiconductor device comprising:
    a substrate;
    a semiconductor element; and
    a ZnAl solder layer sandwiched between the semiconductor element and the substrate, the ZnAl solder layer having an eutectic phase structure content that is no greater than 20%. relative to an entire content of the ZnAl solder layer.

14. The semiconductor device according to claim 13, wherein
the semiconductor element has, as a base body, a wide bandgap semiconductor containing silicon carbide (SiC), gallium nitride (GaN) and diamond (C).

* * * * *